United States Patent
Shimada

[11] 3,988,616
[45] Oct. 26, 1976

[54] DRIVER CIRCUIT FOR LIQUID CRYSTAL DISPLAY USING INSULATED GATE FETS

[75] Inventor: Shunji Shimada, Kodaira, Japan

[73] Assignee: Hitachi, Ltd., Japan

[22] Filed: July 9, 1975

[21] Appl. No.: 594,439

[30] Foreign Application Priority Data
July 15, 1974   United Kingdom............... 31283/74

[52] U.S. Cl.............................. 307/270; 307/205; 307/209; 307/DIG. 1; 340/336; 350/160 LC
[51] Int. Cl.[2] .................... H03K 3/353; G08B 5/36; G02F 1/13; H03K 19/08
[58] Field of Search................ 307/DIG.1, 205, 214, 307/270, 209; 340/336; 350/160 LC

[56] References Cited
UNITED STATES PATENTS
3,775,693   11/1973   Proebsting ..................... 307/205 X
3,896,430   7/1975   Hatsukano ..................... 307/270 X Primary Examiner—John S. Heyman
Assistant Examiner—Larry N. Anagnos
Attorney, Agent, or Firm—Craig & Antonelli

[57] ABSTRACT

A driver circuit comprises an output circuit having a depletion type MOSFET and an enhancement type MOSFET connected in series with the depletion type FET. A voltage V1 is supplied to the drain of the depletion type FET and a voltage V2 is supplied to the source of the enhancement type FET, wherein $|V1| > |V2| > |V_{th}D|$, VthD being the threshold voltage of the depletion type MOSFET. A control signal is supplied directly to the gate of the enhancement type FET and, through an inverter, to the gate of the depletion type FET. As a result, a push-pull driver circuit using E/D MOSFETs is obtained.

11 Claims, 2 Drawing Figures

DRIVER CIRCUIT FOR LIQUID CRYSTAL DISPLAY USING INSULATED GATE FETS

BACKGROUND OF THE INVENTION

1. Field of the Invention

The present invention relates to a drive circuit for driving liquid displays and a driver circuit of the current drive type which may be employed for driving TTL circuitry.

2. Description of the Prior Art

Conventionally, there are known two types of liquid crystal display devices (LCDs), i.e. the dynamic scattering mode type and the field effect mode type. The dynamic scattering mode type of liquid crystal display device has been more widely commercially employed and is used typically in small-sized electronic calculators, due to its low cost.

For driving a liquid crystal display device, complementary metal-oxide-semiconductor circuitry employing complementary P and N channel MOSFETs have been proposed. See, for example, the article entitled "C/MOS Digital Wrist Watch Features Liquid Crystal Display" on Pages 93–97 of Electronics, Published Apr. 10, 1972.

Also, liquid crystal display devices employing driver circuit having C/MOS circuitry are disclosed in patent application Ser. No. 419,348 and patent application Ser. No. 419,442, each entitled "Driving System for Liquid Crystal Display Device", filed Nov. 27, 1973 by Yoshikazu Hatsukano, assigned to the assignee of the present application.

Another type of known driver circuit is the E/E (Enhancement/Enhancement) type P-channel MOS push-pull circuit which employs enhancement MOSFETs for both the load and the switching transistors.

One of the difficulties in employing commercially available C/MOS driver circuits is the relatively low breakdown voltage (about 18 volts). This low breakdown voltage is quite undesirable, especially since, in order to drive LCDs, a breakdown voltage of at least 25 volts is necessary. Moreover, the manufacturing costs of C/MOSICs is quite high due to the complexity of the manufacturing process and the low integration density of the circuitry.

Because of these problems associated with C/MOS driver circuit, E/E type P-type channel MOSICs have proven to be more advantageous.

However, the electric resistance of the dynamic scattering type of LCD is relatively low (about 60 kΩ), and in some instances, LCD are connected in parallel. Accordingly, the parallel connected LCDs consume a relatively large amount of power. Moreover, since the current flowing through the LCDs becomes large, the enhancement type of MOSFET load circuits consume relatively large amounts of power. For example, the power consumption of an eight digit LED using E/E MOS driver circuitry may amount to about 100 mW. As a result, it is desirable to reduce the power consumption of the driver circuit itself.

Furthermore, the electric impedance of LCDs varies over a wide range, depending upon the ambient temperature and the driving systems employed. Therefore, a driver circuit of low impedance is necessary.

BRIEF SUMMARY OF THE PRESENT INVENTION

In order to obviate the above difficulties, the present invention has been developed in order to provide a single channel type MOS driver circuit which is suitable for driving liquid crystal display devices, especially dynamic scattering type LCDs. To this end, a depletion type MOSFET and an enhancement type MOSFET are connected in series. Respective first and second voltages are applied to the drain of the depletion MOSFET and to the source of the enhancement MOSFET, the absolute value of the first voltage being greater than the absolute value of the second voltage. Moreover, the absolute value of the second voltage is at least equal to the threshold voltage of the gate of the depletion type MOSFET. For switching the device, a control signal is supplied directly to the gate of the enhancement type MOSFET and an inverted form thereof is supplied to the gate of the depletion type MOSFET, so that a push-pull driver circuit is provided.

This driver circuit has low power consumption, low impedance and a relatively high breakdown voltage.

DETAILED DESCRIPTION OF THE INVENTION

Figure 1:
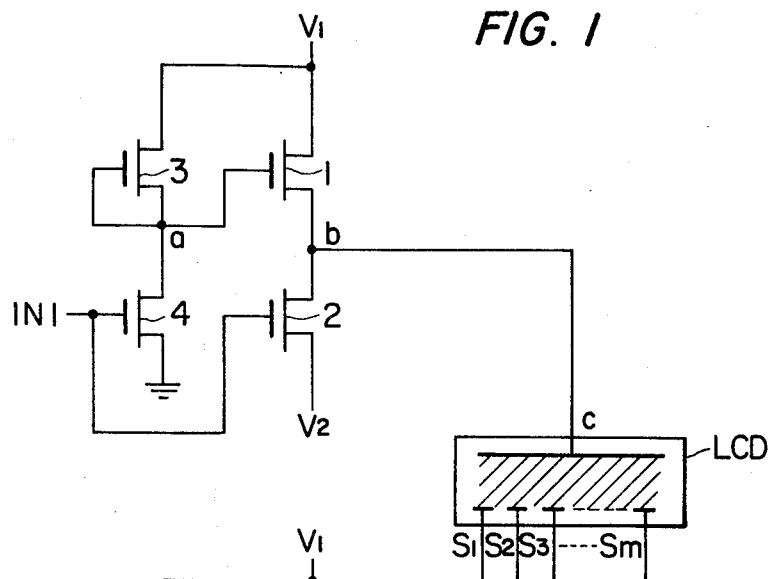
FIG. 1 illustrates an embodiment of the present invention employed in a LCD system, for driving the display device

As is shown in FIG. 1, an LCD has a common electrode C and segment electrodes $S_l-S_m$ disposed in opposing relationship with the liquid crystal therebetween. The respective driver circuits for the LCD are made up of transistors 1–4 and transistors 5–8, respectively. To the inputs of the respective driver circuits control signals IN 1 and IN 2 are supplied, by way of gate circuits, so that the liquid crystal of a prescribed segment will become opaque.

For purposes of explanatory simplicity, only the driver circuit made up of transistors 1–4 will be explained in detail, the other driver circuit operating in the same manner and being made up of the same transistor configuration.

Each of the transistors 1–4 is of the same channel type and for descriptive purposes will be considered to be P-channel type. Transistors 1 and 3 are depletion mode transistors, while MOSFETs 2 and 4 are enhancement type. The gates of transistors 2 and 4 are connected together to receive an input signal IN 1 which may be of a square wave or pulse form between 0 and −10 volts. The gate and source of transistor 3 are connected to point $a$, in common with the drain of transistor 4 and to the gate of depletion transistor 1. The drains of transistors 3 and 1 are connected to receive voltage $V_1$ which may have an absolute value of 20 volts. The source of transistor 2 receives a much lower voltage $V_2$ which may have an absolute value of 3 volts, as shown. The threshold voltages for transistors 1 and 2 may be on the order of 3 volts and −1 volt, respectively. The common connection of the source of transistor 1 with the drain of transistor 2 is connected to the common electrode C of the LCD. The other electrodes of the LCD, i.e. the segment electrodes are respectively connected to individual driving circuits as shown.

In operation, when the input IN 1 is at a low level (a negative voltage) transistors 2 and 4 will be turned on. As a result, the voltage at point $a$ is substantially 0 volts or at ground level, since the source of transistor 4 is grounded. Similarly, the voltage at point $b$ becomes the voltage at the source of transistor 2, i.e. $V_2$.

By appropriately selecting the voltage $V_2$ to have an absolute value at least equal to the threshold voltage of depletion transistor 1, transistor 1 will be turned off. Because transistor 1 will be turned off, the voltage $V_2$ will be supplied to the point $b$ by way of transistor 2.

Now, when the level of the input or control signal IN 1 becomes a high level (0 volts) transistors 2 and 4 will be turned off and the voltage $V_1$ will be supplied to the point $a$, thereby turning transistor 1 ON. With transistor 1 being turned on, and transistor 2 being turned off, the voltage $V_1$ will be supplied to point $b$ and, as a result, supplied to the LCD.

With the above switching of the input voltage IN 1, a push-pull circuit made up of an enhancement and a depletion mode type of transistor configuration is provided.

Since the power source voltage $V_1$ is supplied through the depletion type transistor 1, the impedance of which is low, a low impedance driver circuit is obtained and the power consumption of the transistor 1, through which power for driving the LCD is supplied, is decreased. Furthermore, since the output impedance of the driver circuit is low, the circuit is quite suitable for driving LCDs.

Moreover, since each of the transistors is of the same channel type, the driver circuit has a relatively high breakdown voltage.

Figure 2:
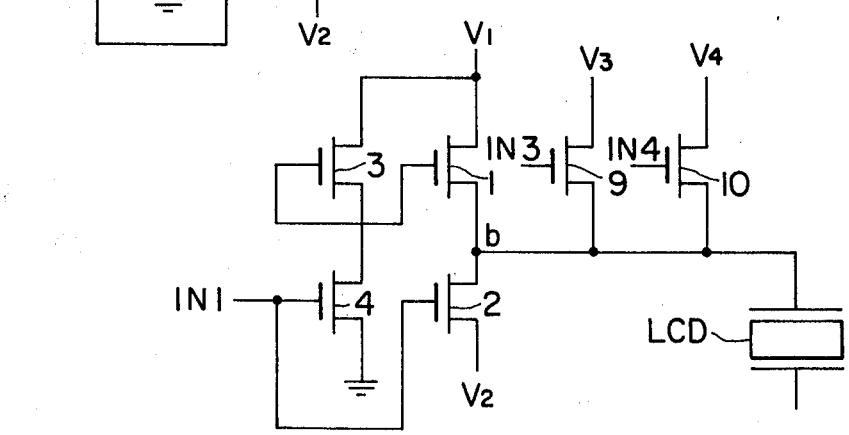
FIG. 2 illustrates a modification of the invention.

In a further embodiment of the invention, as shown in FIG. 2, additional enhancement type MOSFETs 9 and 10, which are of the same channel type as transistors 1–4 (P-channel) may be connected to the point $b$. Additional voltage sources $V_3$ and $V_4$ are connected to the drains of transistors 9 and 10, while control signals IN 3 and IN 4 are supplied to the gates thereof.

For purposes of driving an LCD, the absolute values of the respective voltages will be as follows:

$$|v_1| > |v_3| > |v_4| > |v_2|.$$

Of course, in the above embodiments, although P-channel type transistors have been described, the transistors may be of n-channel type, with the respective voltage polarities reversed.

While I have shown and described several embodiments in accordance with the present invention, it is understood that the same is not limited thereto but is susceptible of numerous changes and modifications as known to a person skilled in the art, and I, therefore, do not wish to be limited to the details shown and described herein but intend to cover all such changes and modifications as are obvious to one of ordinary skill in the art.

I claim:
1. A driver circuit comprising:
    a first depletion mode field effect transistor and a first enhancement mode field effect transistor connected in series, each transistor being of the same channel types
    first means for supplying a first voltage to the drain of said depletion mode transistors;
    second means for supplying a second voltage to the source of said enhancement mode transistor; and
    third means for supplying a control signal directly to the gate of said enhancement mode transistor, and for inverting said control signal and supplying the inverted control signal to the gate of said depletion mode transistor; and wherein
    the absolute value of said first voltage is greater than the absolute value of said second voltage and said second voltage is of sufficient magnitude to turn said depletion mode transistor off when the gate of said depletion mode transistor is at a reference potential, the absolute value of which is smaller than that of said second voltage, at which time the value of said inverted control signal corresponds to said reference potential.

2. A driver circuit according to claim 1 wherein said third means includes
    a second depletion mode field effect transistor and a second enhancement mode field effect transistor connected in series, each transistor being of the same channel type, and wherein
    the drain of said second depletion mode transistor is connected to said first means,
    the source of said second enhancement mode transistor is connected to a source of said reference potential;
    the gate of said second enhancement mode transistor is connected to the gate of said first enhancement mode transistor,
    the gate of said second depletion mode transistor is connected to the source of said second depletion mode transistor and to the gate of said first depletion mode transistor, and
    said control signal is coupled to the gate of said second enhancement mode transistor.

3. A driver circuit according to claim 2, wherein each of said transistors is of the same channel type.

4. A driver circuit according to claim 1, further including at least one additional enhancement mode field effect transistor having its source connected to the junction between said first depletion mode transistor and said first enhancement mode transistor, its gate connected to receive a further control signal, and its drain connected to receive a third voltage, the absolute value of which is less than said first voltage but greater than said second voltage.

5. A driver circuit according to claim 4, wherein said at least one additional enhancement mode field effect transistor is of the same channel type as said first enhancement mode transistor.

6. A driver circuit according to claim 4, wherein said third means includes
    a second depletion mode field effect transistor and a second enhancement mode field effect transistor connected in series, each transistor being of the same channel type, and wherein
    the drain of said second depletion mode transistor is connected to said first means,
    the source of said second enhancement mode transistor is connected to a source of said reference potential,
    the gate of said second enhancement mode transistor is connected to the gate of said first enhancement mode transistor,
    the gate of said second depletion mode transistor is connected to the source of said second depletion mode transistor and to the gate of said first depletion mode transistor, and
    said control signal is coupled to the gate of said second enhancement mode transistor.

7. A driver circuit according to claim 6, wherein each of said transistors is of the same channel type.

8. A driver circuit according to claim 1, wherein said reference potential to ground potential.

9. A driver circuit arrangement for driving a liquid crystal display device comprising:
   a first driver circuit including
      a first depletion mode field effect transistor and a first enhancement mode field effect transistor connected in series, each transistor being of the same channel type;
      first means for supplying a first voltage to the drain of said first depletion mode transistor,
      second means for supplying a second voltage to the source of said first enhancement mode transistor,
      third means for supplying a first control signal directly to the gate of said first enhancement mode transistor, and for inverting said first control signal and supplying the inverted first control signal to the gate of said first depletion mode transistor,
      the absolute value of said first voltage being greater than the absolute value of said second voltage, and said second voltage being of sufficient magnitude to turn said first depletion mode transistor off when the gate of said first depletion mode transistor is at a reference potential, the absolute value of which is smaller than that of said second voltage at which time the value of said inverted control signal corresponds to said reference potential; and
   a second driver circuit including
      a second depletion mode field effect transistor and a second enhancement mode field effect transistor connected in series, each transistor being of the same channel type;
      third means for supplying said first voltage to the drain of said second depletion mode transistor,
      fourth means for supplying said second voltage to the source of said second enhancement mode transistor, and
      fifth means for supplying a second control signal directly to the gate of said second enhancement mode transistor, and for inverting said second control signal and supplying the inverted second control signal to the gate of said second depletion mode transistor; and wherein
   the common connection of said first depletion mode transistor and said first enhancement mode transistor is connected to a common electrode of said liquid crystal display device, and the common connection of said second depletion mode transistor and said second enhancement mode transistor is connected a segment electrode of said liquid crystal display device.

10. A driver circuit arrangement according to claim 9, wherein said third means includes
   a third depletion mode field effect transistor and a third enhancement mode field effect transistor connected in series, each transistor being of the same channel type, and wherein
   the drain of said third depletion mode transistor is connected to said first means,
   the source of said third enhancement mode transistor is connected to a source of said reference potential,
   the gate of said third enhancement mode transistor is connected to the gate of said first enhancement mode transistor,
   the gate of said third depletion mode transistor is connected to the source of said third depletion mode transistor and to the gate of said first depletion mode transistor, and
   said first control signal is coupled to the gate of said third enhancement mode transistor; and wherein said fifth means includes
   a fourth depletion mode field effect transistor and a fourth enhancement mode field effect transistor connected in series, each transistor being of the same channel type, and wherein
   the drain of said fourth depletion mode transistor is connected to said third means,
   the source of said fourth enhancement mode transistor is connected to a source of said reference potential,
   the gate of said fourth enhancement mode transistor is connected to the gate of said second enhancement mode transistor,
   the gate of said fourth depletion mode transistor is connected to the source of said fourth depletion mode transistor and to the gate of said second depletion mode transistor, and
   said second control signal is coupled to the gate of said fourth enhancement mode transistor.

11. A driver circuit arrangement according to claim 10, wherein said reference potential is ground potential.

* * * * *